United States Patent [19]

Thomas

[11] Patent Number: 4,984,254
[45] Date of Patent: Jan. 8, 1991

[54] FREQUENCY COUNTER

[75] Inventor: Neil E. Thomas, St. Albans, United Kingdom

[73] Assignee: Marconi Instruments Limited, St. Albans, United Kingdom

[21] Appl. No.: 319,706

[22] Filed: Mar. 7, 1989

[30] Foreign Application Priority Data

Apr. 21, 1988 [GB] United Kingdom ................ 8809398

[51] Int. Cl.$^5$ .............................................. H04L 7/00
[52] U.S. Cl. ................................ 375/106; 324/79 R; 328/141
[58] Field of Search ........................ 375/106, 114, 116; 324/79 R, 79 D, 78 R, 78 D; 364/484; 328/140, 141

[56] References Cited

U.S. PATENT DOCUMENTS

| | | | |
|---|---|---|---|
| 3,235,800 | 2/1966 | Turrell | 324/79 |
| 3,735,387 | 5/1973 | Miller | 324/78 D |
| 4,142,177 | 2/1979 | Davis | 328/140 |
| 4,215,308 | 7/1980 | Kusters | 324/78 D |
| 4,420,809 | 12/1983 | Pierce | 364/484 |
| 4,599,650 | 7/1986 | Wilkinson | 375/106 |

FOREIGN PATENT DOCUMENTS

| | | |
|---|---|---|
| 2552079 | 5/1977 | Fed. Rep. of Germany . |
| 1272734 | 5/1972 | United Kingdom . |
| 1565078 | 11/1976 | United Kingdom . |
| 1548726 | 7/1979 | United Kingdom . |
| 1583855 | 2/1981 | United Kingdom . |

OTHER PUBLICATIONS

Toute L'Electronique, No. 456, Aug.-Sep. 1980, pp. 71-74, Paris, FR; L. Chataignier: "Philips: les frequencemetres a haute resolution, pm 666/68".
E.D.N. Electrical Design News, vol. 28, No. 17, Aug. 1983, p. 211, Boston, Mass., U.S.: M. E. Satinosky: "PLL measures low frequencies".
Soviet Inventions Illustrated, week 8338, Nov. 2, 1983, abstract No. 770415/38, Derwent Pub., Ltd, London, GB: & SU-A-976-396 (V. F. Tikhomirov) 11-23-1982.
IEEE Transactions on Instrumentation and Measurement, vol. IM-19, No. 1, Feb. 1970, pp. 34-45; W. H. Farthing: "Wide-band High-resolution Determination of Absolute Frequency:" p. 36, Chapter 2: Solution.
New Electronics, vol. 18, No. 8, Apr. 1985, pp. 34, 36, 38, 39, 41, London, GB; G. Carter et al.: "Counter Technology Emerges for the 1990s"; Figure 3.

Primary Examiner—Benedict V. Safourek
Assistant Examiner—Stephen Chin
Attorney, Agent, or Firm—Spencer & Frank

[57] ABSTRACT

A frequency counter for counting pulses of a variable input signal (Fin) using another input signal (Fgate) of a different, fixed frequency as a reference, includes a noise-shaping synchronizer (20,23,24) for retiming pulses of the lower frequency input signal to have a fixed timing relationship with selected pulses of the higher frequency input signal such as to introduce substantially less phase noise onto the lower frequency input at low modulation rates that would be the case with a simple synchronizer; and a counter and a latch (11,12) responsive to the retimed pulses (13) and to the higher frequency input signal (Fin) to provide a data output representative of the ratio between the frequencies of the input signals.

14 Claims, 5 Drawing Sheets

FREQUENCY COUNTER

BACKGROUND OF THE INVENTION

This invention relates to a frequency counter for counting pulses of a variable input signal using another input signal of a different fixed frequency as a reference. Such frequency counters are commonly used to measure the frequency of signals and in some cases the noise characteristics of RF (Radio Frequency) sources.

A conventional frequency counter consists of a signal gate followed by a counter. The signal gate is caused to open for a known period of time, which is usually a predetermined number of cycles of a stable reference frequency. The counter counts the number of input cycles that occur during this gate time, this count being representative o the ratio of the input signal frequency to the reference frequency.

The performance of such a conventional counter will now be discussed with reference to FIG. 1 of the accompanying drawings, which shows a train I of input signal pulses and, on the same time axis, the gate signal G. If the gate time was an integral number of input periods long, as is shown in FIG. 1, then the leading and trailing edges of the gate pulse would be equally spaced from the respective next succeeding input pulses, i.e. the intervals ta and tb would be equal. The count would then represent exactly the ratio of the input frequency to the gate frequency. In general, however, this is not the case and the gate signal and input signal are uncorrelated. The difference between the actual gate time, and the gate time that would return an exact frequency count is ta−tb. As both ta and tb can vary from zero to one input period, the total error on the gate time will vary over +/−1 input period. The fractional error introduced into the count by this uncertainty is (ta−tb) divided by the gate time. This result is equivalent to the more common statement that the error of a counter is +/− one count, or +/− the gate frequency. As the error is dependent on the gate time used, the design of a conventional counter involves a trade-off between speed and resolution.

There are three main ways, known in the art, of improving this trade-off, i.e. of reducing the fractional uncertainty without increasing the reading time.

The first two of these ways make use of the fact that the uncertainty in the gate time is proportional to the period of the counted signal. Both ways involve putting a frequency higher than the input frequency into an otherwise conventional counter.

According to the first way, the frequency of the counted input signal is raised by using a high frequency VCO (voltage controlled oscillator), locked through a fixed divider to the input signal in a phase locked loop arrangement. The magnitude of the error falls directly as a function of the multiplication factor of the loop. This method is only useful when the input frequency is sufficiently low to be cheaply and conveniently multiplied in this way.

The second way is useful whenever the input frequency is lower than the reference frequency. The gate signal is derived from the input signal instead of the reference signal, and the reference frequency (higher than the input frequency) is counted. Since a counter only compares the ratio of two frequencies, it does not matter which frequency is counted and which is used to derive the gate. Although the reading from the counter now represents the period rather than the frequency of the input signal, a reciprocal conversion is trivial for any processor-based instrument.

The third way of improving the trade-off between speed and resolution is more recent than the first two: the error on the gate time is reduced by measuring the actual time delays, i.e. ta and tb, between the edges of the gate signal and the input signal, using fast timing circuits.

The purpose of the present invention is to control the time error involved in the necessary synchronisation of the input and reference signals rather than to estimate or to ignore the time error.

BRIEF SUMMARY OF THE INVENTION

The invention provides a frequency counter for counting pulses of a variable input signal using another input signal of a different, fixed frequency as a reference, comprising: noise-shaping synchronising means for retiming pulses of the input signal of the lower frequency to have a fixed timing relationship with selected pulses of the input signal of the higher frequency, the action of the noise-shaping synchronising means being such as to introduce substantially less phase noise onto the lower frequency input at low modulation rates than would be the case with a simple synchroniser; means responsive to the retimed pulses of lower frequency from the noise-shaping synchronising means and to the higher frequency input signal to provide a data output signal representative of the ratio between the frequencies of the input signals., and means responsive to the data output signal to provide data at the same or lower rate representing frequencies at modulation rates for which there is negligible synchronisation phase error.

The frequency counter of the invention controls the time error down to an arbitrarily small value by using a noise shaping synchronising means in a control loop, the principles of which as applied to a one bit A to D convertor are disclosed in: "An Experimental 16-Bit A/D Converter for Digital Audio Applications" by E.C. Dijkmans and P.J.A. Naus, I.E.E. Colloquium on Advanced A/D Conversion Techniques (Digest No. 48) London, England (15th April, 1987). A formal derivation of the error spectrum associated with noise-shaping can be found from: "Reduction of Quantizing Noise by use of Feedback" by H.A. Spang and P.M. Schultheiss, I.R.E. Trans, Commun. Sys., pp. 373–380 December, 1962.

In a preferred form, the noise-shaping synchronising means comprises a phase sensitive detector followed by a low pass filter, the output of which goes to pulse selecting synchronising means capable of selecting which of several future input pulses of the higher frequency input signal to use to provide the retimed pulses. Advantageously the low pass filter consists of several broken integrator stages i.e. filter stages having a high gain at low frequencies, and a low phase shift at frequencies of the order of the loop bandwidth of the noise-shaping synchroniser loop.

The means for determining the ratio between the input signals, of which the one with the lower frequency has been retimed by the noise shaping synchronising means, may be a multi-bit counter gated by the retimed pulses and clocked by the higher frequency input signal. Alternatively, it may be a binary counting circuit, e.g. a simple data latch, clocked by the retimed pulses and gated by the higher frequency input signal to produce the said data output in the form of a binary data stream.

The invention will now be illustrated by way of several examples with reference to the accompanying diagrammatic drawings, in which:

BRIEF DESCRIPTION OF THE DRAWINGS

In the drawings, circuit elements fulfilling equivalent functions are denoted by the same reference numerals.

DETAILED DESCRIPTION OF PREFERRED EMBODIMENTS OF THE INVENTION

Figure 1:
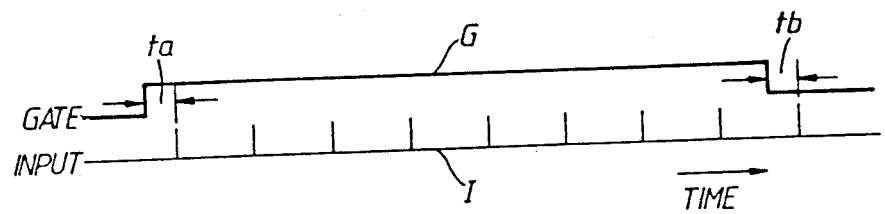
FIG. 1, to which reference has already been made, is a timing diagram illustrating, on the same time axis, an input pulse stream and a gate control pulse stream.
Figure 2:
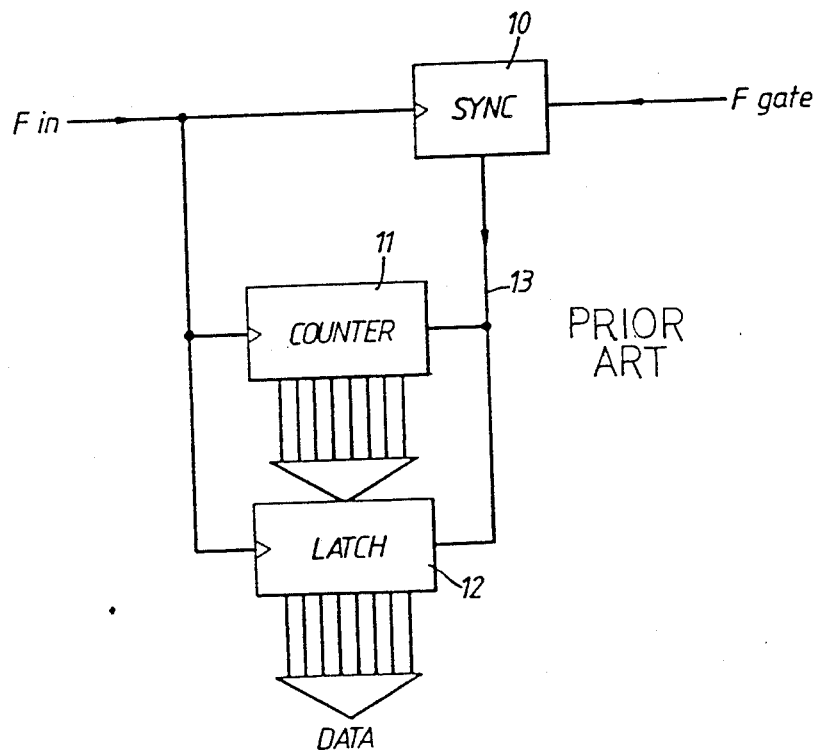
FIG. 2 is a circuit diagram of a conventional frequency counter.

A conventional frequency counter is shown in FIG. 2. A variable input frequency Fin is fed to a synchronisation circuit 10 and as a clock input to a counter 11 and a latch 12, while a stable reference frequency Fgate is fed to another input of the synchronisation circuit 10. The output of the synchronisation circuit 10 consists of a gate control pulse stream 13 in binary form which serves as a gate control signal for the counter 11 and also as a control signal for the latch 12 connected to receive the count output from the counter 11. A binary 1 in the gate control signal 13 acts as a "clear enable" for the counter 11 and a "load enable" for the latch 12, while a binary zero acts as a "count enable" for the counter 11 and a "hold enable" for the latch 12.

Figure 3:
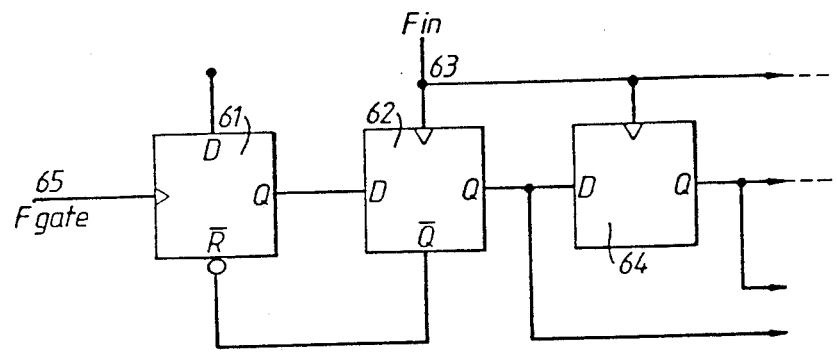
FIG. 3 is a circuit diagram of a simple synchroniser forming part of a frequency counter.

An example of the simple synchroniser 10 is shown in FIG. 3. Each pulse of the low frequency input 65 sets the first flip flop 61. On the next pulse of the high frequency input 63, the 1 state at the Q output of 61 is clocked into the D latch 62. The Q output of 62 goes active low, and resets the input flip flop. On the next pulse at the high frequency input 63, D latch 62 clocks in the zero on the Q output of the first flip flop. In this manner, each pulse on the low frequency input 65 results in each D latch clocked by the high frequency input 63 going into a 1 state for one cycle of the high frequency input. The resynchronised output may be taken from the output of D latch 62, or from any one of a plurality of D latches connected so as to form a shift register, the first one only being shown as 64.

On each occurrence of Fgate, the synchronisation circuit 10 produces a pulse synchronised to the next suitable pulse of Fin, such that the counter 11 and the latch 12 operate correctly. The reference signal Fgate is thus synchronised to the input signal Fin without taking account of the different delays that are accorded to different pulses of Fgate, due to the lack of coherence between Fin and Fgate.

A first example of the present invention will now be described with reference to FIG. 4. A frequency counter comprises a counter 11 and latch 12 connected similarly to the conventional circuit of FIG. 2 except that their gate control pulse stream 13 is provided by a noise shaping synchroniser 20, 23 and 24. The noise shaping synchroniser comprises, a simple synchroniser 10, a conventional, 3 or more state, phase sensitive detector 24, low pass filter 23, which advantageously may consist of several broken integrator stages, and a voltage controlled oscillator (VCO) 22. The variable input signal Fin, of a frequency higher than Fgate, is fed to the simple synchroniser 10, and the stable reference frequency Fgate is fed as a second input to the phase sensitive detector 24.

In effect, the VCO 22 and the simple synchroniser 10 function together as a noisy VCO 20. The output 13 of this noisy VCO 20 is a synchronised output at a mean frequency determined by the reference frequency Fgate. The precise timing of each pulse of the synchronised output 13 is dependent on the timing of the variable input signal Fin. As the output frequency of the real VCO 22 is uncorrelated with the input signal Fin, the effect of this retiming will be to add flat phase noise to the frequency spectrum of the output. The phase sensitive detector 24 and loop filter 23 complete the phase locked loop, thus a control loop is closed round an otherwise simple synchroniser. The phase error created by replacing a pulse on the low frequency input signal with a pulse selected from one of many on the high frequency input signal is used to modify the selection of future pulses. An increasing or decreasing phase error can be used to select later or earlier pulses. In this way, the control loop can be made stable, and be made to hold the phase error bounded. If the loop filter has very high gain at low frequencies, the actual phase error can be made very small at low modulation frequencies and so the noisy VCO 20 tracks the reference signal Fgate in both frequency and phase.

The frequency spectrum L(f) of the locked noisy oscillator 20 can be expressed as follows:

$$L(f) = \frac{(R(f) \times G(f) + U(f))}{(1 + G(f))}$$

where R(f) is the spectrum of the reference signal Fgate: U(f) is the spectrum of the unlocked noisy oscillator; and G(f) is the loop gain which is equal to the VCO gain multiplied by the phase sensitive detector gain multiplied by the transfer function H(f) of the loop filter 23 and divided by the frequency f.

For all phase locked loops, the loop gain G(f) is very large at low frequency tending to infinity at DC, and falls to unity at a frequency called the loop bandwidth. The loop bandwidth frequency is always a factor of three or more less than the VCO frequency. At high frequencies, where G(f) is less than unity, the locked oscillator noise becomes essentially that of the unlocked oscillator. At low frequencies, where G(f) becomes large, the locked oscillator spectrum L(f) is essentially that of the reference signal R(f) with the addition of approximately $$\frac{U(f)}{G(f)}.$$

As the loop gain G(f) increases, this oscillator noise term can be suppressed down to a negligible amount.

The phase locked loop is of a high order and a wide bandwidth in order to obtain the maximum possible attenuation of the synchroniser phase noise. The result of this is that while the locked oscillator output is properly synchronised to the input Fin, its low frequency spectrum, i.e. its instantaneous frequency at low modulation rates of the variable input signal, has not been affected by the synchronisation process. The phase noise of the synchronisation process, which causes the conventional counter error, is suppressed by the phase locked loop.

Figure 4:
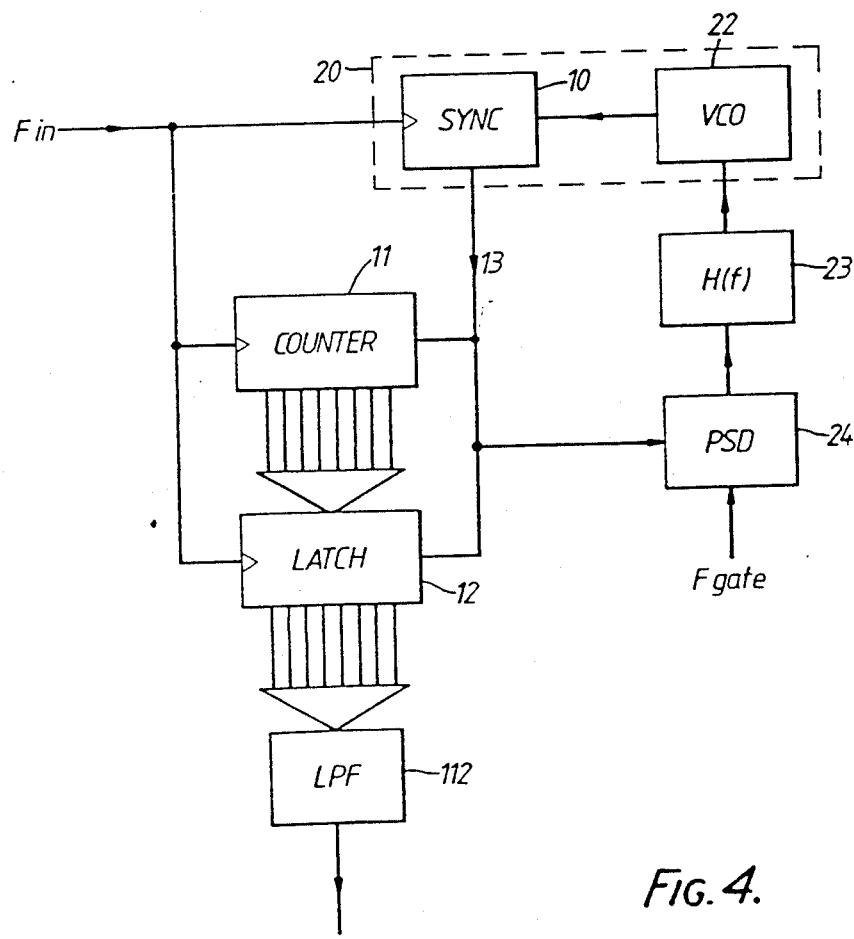
FIG. 4 is a circuit diagram of a frequency counter including the noise shaping synchroniser and embodying the invention.

With further reference to FIG. 4 each datum produced by the counter 11 is, as in the circuit of FIG. 2, the exact ratio of the input frequency to the counter gate frequency. However, now the counter gate signal 13 has no low frequency phase noise added to it by the synchronising process, and so the sequence of counts produced at the latch 12 now corresponds to the true frequency of the input signal Fin at low modulation rates thereof.

At high modulation rates the data signal 13 still contains much noise, so that the sequence of counts cannot be used directly as the frequency of the input signal Fin. High frequency noise would be aliased down to baseband, when the data output is resampled to a lower data rate. Accordingly, the high frequency noise is filtered from the data output from the latch 12. A conventional digital low pass filter 112 of adequate flatness at low frequencies and supression at high frequencies is connected to the output of the latch 12. The most appropriate type of filter seems to be an FIR (finite impulse response) filter, since the data rate from the latch 12 is very much higher than the Nyquist rate of the recoverable frequency modulation on the input signal Fin: only every Nth output sample is calculated, to achieve an efficient filtration and data rate decimation in on go.

Figure 5:
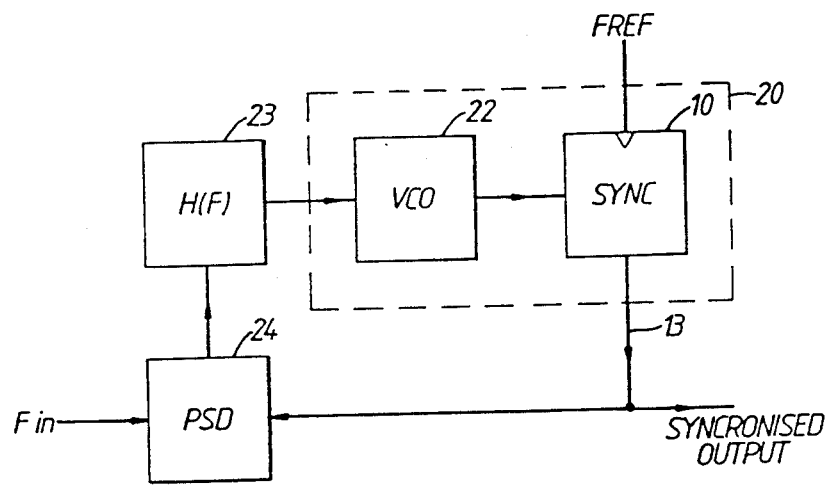
FIGS. 5, 6, 7, 8 and 9 are all circuit diagrams of different forms of feedback loop each forming part of a frequency counter embodying the present invention.

An alternative form of the invention shown in FIG. 5, uses a reference frequency higher than the input frequency. The noise-shaping synchroniser still retimes the lower frequency input with respect to the higher frequency input; the low frequency retimed signal is now the unknown input frequency, and the high frequency signal is now the reference. The means for comparing the ratio of the two frequencies now degenerates to a one bit latch, which is invariably provided as part of the simple synchroniser 10. Hence the data stream 13 emerging from this latch is just the 1 bit data stream containing the frequency information. This data stream is digitally low pass filtered in exactly the same way as for the first form of the invention.

The two forms of the invention described above are characterised by their respective ratios between the frequency of the variable input signal Fin, and the fixed input signal Fref. In the first form, the input signal frequency is greater than the data rate from the counter. In the second form, the input signal frequency is lower than the data rate from the counter. In practice, the lower limit of the ratio between the input frequency and the data rate is about 5. This limit is determined mainly on the stability criteria for the phase locked loop.

In both cases described above, the noise shaping synchronising means is implemented as a phase locked loop containing a VCO and a simple synchroniser, as well as a phase sensitive detector and a loop filter. However, the only essential features of a noise-shaping synchroniser are that it contains: a phase sensitive detector to detect errors in phase; a loop filter to ensure stability of the control loop; and means responsive to the output of the loop filter for selecting which of several future pulses on the higher frequency input to select to form a new output pulse train which is to be used as the synchronised output.

In the examples described above the means for selecting pulses from the higher input frequency signal consists of a VCO followed by a simple synchroniser.

The noise-shaping synchroniser can be built in many different ways.

The means capable of selecting which of several future output pulses to use to represent the input pulse can consist of one of many superficially different configurations. There are two main types. The first uses an analogue controlled timing element, which can be a controllable delay triggered from the low frequency input, or a controlled oscillator., either of which is then followed by an otherwise simple synchroniser circuit. The second type uses some means to convert the output of the low pass loop filter into digital form. This digital word is then used to either digitally delay the output of a simple synchroniser, i.e. select the nth pulse following the simple synchroniser output, or is used to control a digitally controlled oscillator, or divider running from the high frequency signal.

Examples illustrating the diversity of such noise shaping synchronisers are given in FIGS. 6 to 9. In each case, the reference input signal Fgate may be higher or lower in frequency than the input signal Fin: the input signals are identified as the higher and lower frequency input signals.

Figure 6:
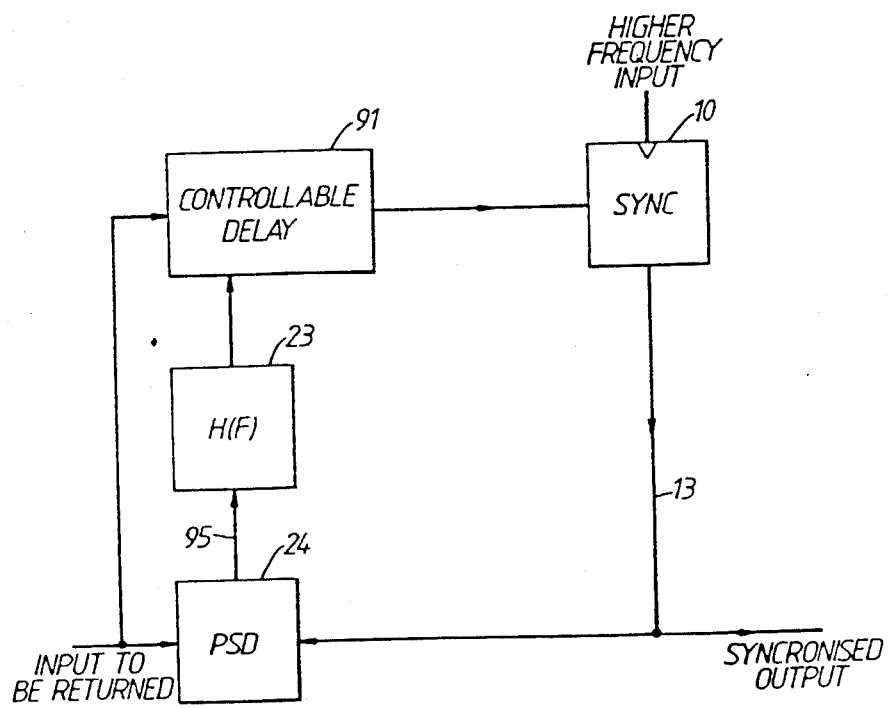

The circuit of FIG. 6 uses a controllable delay element 91 to delay the lower frequency input pulse, before synchronising it with the higher frequency input in the simple synchroniser 10. The synchronised output 13 is compared with the lower frequency input in the phase sensitive detector 24. The output 95 of the PSD is used via the loop filter 23 to control the delay element 91 to minimise the phase error in the output 95.

Figure 7:
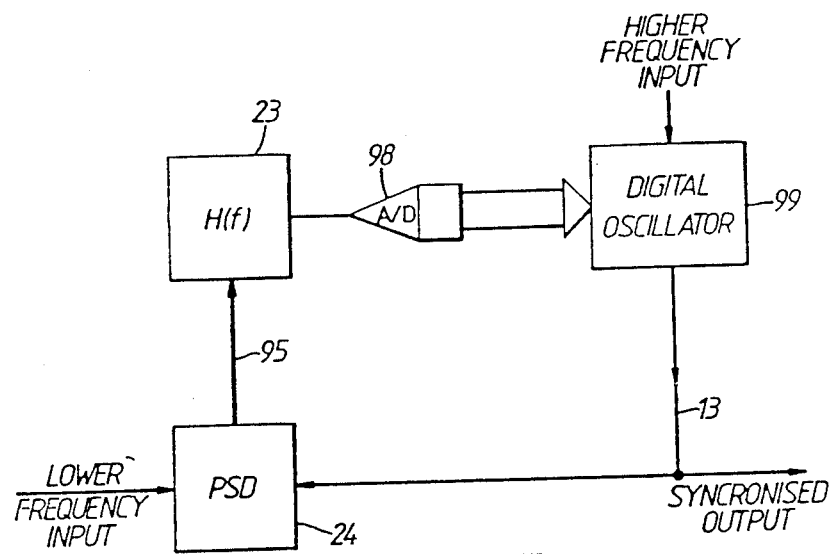

The circuit of FIG. 7 uses an analogue to digital conversion means 98 to control the output frequency of a digital oscillator 99. The output pulses of the digital oscillator are inherently synchronised to the high frequency input. The digital oscillator is a circuit responsive to a digital control signal, which will produce 2 or more different output frequencies in response to different digital inputs. For loop stability, a monotonic change in analogue input to the A to D converter 98 must result in a monotonic change in oscillator frequency.

Figure 8:
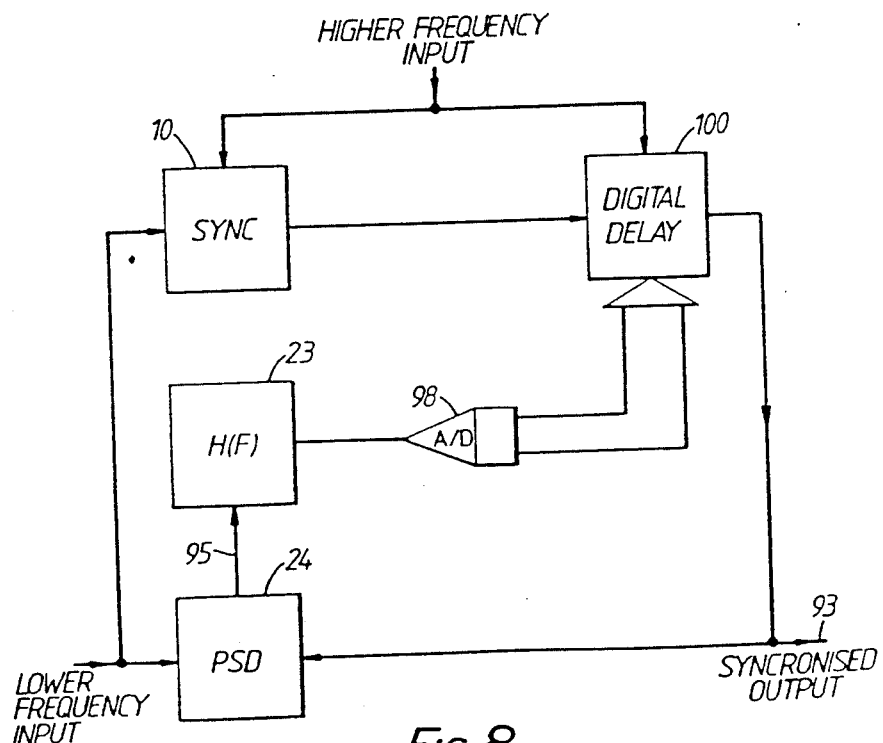

The circuit of FIG. 8 uses an analogue to digital conversion means 98 to select the delay that the digital delay means 100 will give to each pulse produced by the simple synchroniser 10. The phase error between the output of the delay 100 and the low frequency input signal is measured by the PSD 24, and via the loop filter 23 and A/D 98 is used to control the delay 100 to minimise the phase error.

Figure 9:
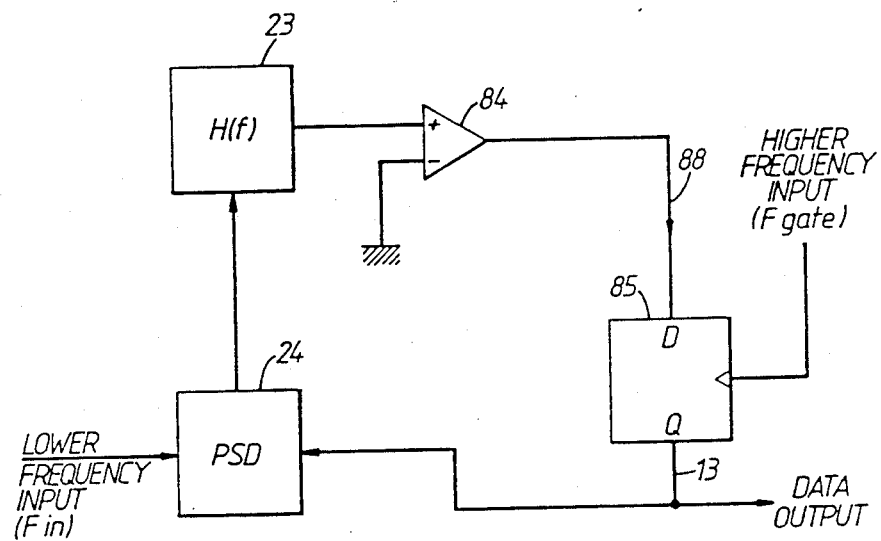

The circuit of FIG. 9 is a particular example of that of FIG. 7, (a noise shaping synchroniser using an analogue to digital conversion means, followed by a digitally controlled oscillator). The comparator 84 digitises the output voltage from the loop filter 23 into one of two binary values. This output 88 is effectively that of a digitally controlled oscillator. When viewed as data with respect to the higher frequency input, say Fgate, a binary 1 is equivalent to a frequency of Fgate, as the Q output 13 from the latch 85 records a count of 1 for every Fgate pulse, and a binary zero is equivalent to a frequency of zero by the same argument. As the resynchronised output needs to be counted only in a one bit counter, this function has already been done by latch 85, therefore output 13 is both the resynchronised version of the lower frequency input, say Fin, and the data output from the counter. The phase sensitive detector 24 completes the loop by measuring the phase difference between Fin and its synchronised version. In a practical system, a further latch or latches would be added to latch 85 in the form of a shift register, to overcome the effects of metastability.

The operation of this control loop is different in detail to the VCO version described above. The phase sensitive detector must be able to cope with several cycles of phase error in contrast to the previous versions which only need to handle +/− 0.5 cycles. The input frequency can cover the range 0.3 to 0.7 times the higher frequency reference signal.

I claim:

1. A frequency counter for counting pulses of a variable input signal using another input signal of a different, fixed frequency as a reference, said counter having input ports for receiving said variable input signal and said reference input signal, the frequency of one of said input signals being higher than that of the other of said input signals, comprising:

noise-shaping synchronising means for retiming pulses of the input signal of the lower frequency including means for selecting pulses of the input signal of the higher frequency, said retimed pulses having a fixed timing relationship with selected pulses of the input signal of the higher frequency, the action of the noise-shaping synchronising means introducing substantially less phase noise onto the lower frequency input signal at low modulation rates than would be the case with a simple synchroniser;

means responsive to said retimed pulses of lower frequency form the noise-shaping synchronising means and responsive to the higher frequency input signal for providing a data output signal representative of the ratio between the frequencies of the two input signals; and means responsive to said data output signal for providing data at the same or a lower rate representing frequencies at modulation rates for which there is negligible synchronisation phase error.

2. A frequency counter according to claim 1, wherein the noise-shaping synchronising means comprises a phase sensitive detector, the output of which is connected to a low pass filter, the output of the low pass filter being connected to the pulse-selecting synchronising means capable of selecting which of several future input pulses of the higher frequency input signal to use to provide the retimed pulses.

3. A frequency counter as claimed in claim 2 wherein the low pass filter consists of several broken integrator stages.

4. A frequency counter according to claim 1, wherein the means for determining the frequency ratio between the input signals comprises a multi-bit counter gated by the retimed pulses and clocked by the higher frequency input signal.

5. A frequency counter according to claim 2 wherein the pulse-selecting synchronising means comprises a comparator responsive to the output of the low pass filter to provide an output to a binary latch responsive also to the higher frequency input signal to provided the retimed pulses so as to act as a binary VCO.

6. A frequency counter for counting pulses of a variable input signal using another input signal of a different, fixed frequency as a reference, said counter having input ports for receiving said variable input signal and said reference input signal, the frequency of one of said variable input signal and said reference input signal being higher than that of the other input signal, comprising:

noise-shaping synchronising means for retiming pulses of the input signal of the lower frequency including means for selecting pulses of the input signal of the higher frequency, said retimed pulses having a fixed timing relationship with the selected pulses, the action of the synchronising means introducing substantially less phase noise onto the lower frequency input signal at low modulation rates than would be the case with a simple synchroniser;

means, responsive to said retimed pulses of lower frequency from the noise-shaping synchronising means, for providing a data output signal representative of the ratio between the frequencies of the variable and reference input signals; and means responsive to said data output signal for providing data at the same or a lower rate representing frequencies at modulation rates for which there is negligible synchronisation phase error.

7. A frequency counter according to claim 6, wherein the noise-shaping synchronising means comprises a phase detector, the output of which is connected to a low pass filter, the output of the low pass filter being connected to the pulse-selecting means selecting several future input pulses of the higher frequency to provide the retimed pulses.

8. A frequency counter according to claim 7, wherein the pulse-selecting synchronising means comprises a controllable delay device responsive to the output of the low pass filter to provide an output to a simple synchroniser, for providing the retimed pulses.

9. A frequency counter according to claim 7, wherein the pulse-setting synchronising means comprises an analogue to digital converter responsive to the output of the low pass filter to provide an output to a digital oscillator, for providing the retimed pulses.

10. A frequency counter according to claim 7 wherein the retimed pulses from the pulse-selecting synchronising means constitute the said data output.

11. A frequency counter according to claim 6, wherein the means for determining the frequency ratio between the input signals comprises a binary counting circuit, clocked by the retimed pulses and gated by the higher frequency input signal to produce the said data output in the form of a binary data stream.

12. A frequency counter according to claim 7, wherein the pulse-selecting synchronising means comprises a voltage controlled oscillator the output of which is fed to a simple synchroniser.

13. A frequency counter according to claim 7, wherein the low pass filter consists of several broken integrator stages.

14. A frequency counter for counting pulses of a variable input signal using another input signal of a different, fixed frequency as a reference, said counter having input ports for receiving said variable input signal and said reference input signal, the frequency of one of said input signals being higher than that of the other of said input signals, comprising:

noise-shaping synchronising means for retiming pulses of the input signal of the lower frequency including means for selecting pulses of the input signal of the higher frequency, said retimed pulses having a fixed timing relationship with the selected pulses, the action of the noise-shaping synchronising means redistributing and reducing the phase noise of the lower frequency input signal;

means responsive to said retimed pulses of lower frequency form the noise-shaping synchronising means and responsive to the higher frequency input signal for providing a data output signal representative of the ratio between the frequencies of the two input signals; and means responsive to said data output signal for providing data at the same or a lower rate representing frequencies at modulation rates for which there is negligible synchronisation phase error.

* * * * *